United States Patent
Ishida et al.

(10) Patent No.: US 8,263,175 B2
(45) Date of Patent: Sep. 11, 2012

(54) METHOD FOR MANUFACTURING COLOR ORGANIC EL DISPLAY

(75) Inventors: Taizo Ishida, Okazaki (JP); Kahoru Mori, Toyokawa (JP); Shigeru Miyaji, Obu (JP); Shoichi Kawai, Kuwana (JP); Ryonosuke Tera, Toyota (JP); Koji Ino, Kariya (JP)

(73) Assignee: DENSO CORPORATION, Kariya (JP)

( * ) Notice: Subject to any disclaimer, the term of this patent is extended or adjusted under 35 U.S.C. 154(b) by 559 days.

(21) Appl. No.: 12/385,092

(22) Filed: Mar. 31, 2009

(65) Prior Publication Data
US 2009/0191781 A1    Jul. 30, 2009

Related U.S. Application Data

(62) Division of application No. 11/184,080, filed on Jul. 19, 2005, now abandoned.

(30) Foreign Application Priority Data

Jul. 20, 2004 (JP) .................. 2004-211593
Feb. 14, 2005 (JP) .................. 2005-35891
May 30, 2005 (JP) .................. 2005-157722

(51) Int. Cl.
B05D 5/06 (2006.01)
B05D 5/12 (2006.01)

(52) U.S. Cl. .......................... 427/66; 445/24

(58) Field of Classification Search .............. None
See application file for complete search history.

(56) References Cited

U.S. PATENT DOCUMENTS

| 5,686,360 A | 11/1997 | Harvey, III et al. |
| 5,909,081 A | 6/1999 | Eida et al. |
| 6,217,665 B1 | 4/2001 | Suzuki |
| 6,641,933 B1 | 11/2003 | Yamazaki et al. |
| 7,215,075 B2 | 5/2007 | Kurata |
| 7,537,662 B2 * | 5/2009 | Soininen et al. ............ 118/715 |
| 2001/0031379 A1 | 10/2001 | Tera et al. |
| 2001/0052752 A1 | 12/2001 | Ghosh et al. |
| 2003/0222577 A1 | 12/2003 | Lu |

FOREIGN PATENT DOCUMENTS

| EP | 1 115 269 | 7/2001 |
| JP | A-10-12383 | 1/1998 |
| JP | A-2003-229271 | 8/2003 |
| JP | A-2003-282239 | 10/2003 |
| JP | A-2004-39468 | 2/2004 |

OTHER PUBLICATIONS

Sun Jin Yun, et al., "Passivation of organic light-emitting diodes with aluminum oxide thin films grown by plasma-enhanced atomic layer deposition," Appl. Phys. Lett. 85, (2004), pp. 4896-4898.
A. P. Ghosh, et al., "Thin-film encapsulation of organic light-emitting devices," Appl. Phys. Lett. 86, (2005), 223503-1-223503-3.

* cited by examiner

Primary Examiner — Monica A Huson
(74) Attorney, Agent, or Firm — Posz Law Group, PLC

(57) ABSTRACT

A color organic EL display includes: a substrate; a color filter layer disposed on the substrate; a gas barrier layer disposed on the color filter layer; and an organic EL structural body disposed on the gas barrier layer. The substrate and the color filter layer provide an underlayer of the gas barrier layer. The underlayer is a degassed underlayer. The gas barrier layer is provided by an atomic layer deposition method at a temperature equal to or lower than a decomposition starting temperature of the color filter layer.

14 Claims, 8 Drawing Sheets

FIG. 8

| SAMPLE | DEPOSITION METHOD | BARRIER LAYER | FILEM THICKNESS | NO. OF PIN HOLES |
|---|---|---|---|---|
| NO. 1 | ALE | Al2O3 | 30nm | 0 |
| NO. 2 | ALE | Al2O3 | 30nm | 0 |
| NO. 3 | ALE | Al2O3 | 30nm | 0 |
| NO. 4 | ALE | Al2O3 | 30nm | 0 |
| NO. 5 | ALE | Al2O3 | 30nm | 0 |
| NO. 6 | ALE | Al2O3 | 30nm | 0 |
| NO. 7 | ALE | Al2O3 | 60nm | 0 |
| NO. 8 | ALE | Al2O3 | 60nm | 0 |
| NO. 9 | ALE | Al2O3 | 60nm | 0 |
| NO. 10 | ALE | Al2O3 | 60nm | 0 |
| NO. 11 | SPUTTER | SiO2 | 60nm | 12 |
| NO. 12 | SPUTTER | SiO2 | 300nm | 17 |
| NO. 13 | SPUTTER | SiO2 | 300nm | 9 |
| NO. 14 | SPUTTER | SiO2 | 300nm | 21 |
| NO. 15 | SPUTTER | SiO2 | 300nm | 15 |

FIG. 9

| DEGASSING CONDITION | GAS BARRIER LAYER |
|---|---|
| UNPROCESSED | PEELING OFF |
| 200°C, 10MIN | PEELING OFF |
| 200°C, 20MIN | PEELING OFF |
| 200°C, 60MIN | NO PEELING OFF |
| 200°C, 120MIN | NO PEELING OFF |

FIG. 10

| | FILM THICKNESS | CRACK |
|---|---|---|
| $Al_2O_3$ | 30nm | NO CRACK |
| | 100nm | NO CRACK |
| | 120nm | CRACKS |
| $TiO_2/Al_2O_3$ | 9nm/30nm | NO CRACK |
| | 10nm/30nm | NO CRACK |
| | 15nm/30nm | NO CRACK |
| | 20nm/30nm | NO CRACK |

FIG. 11

| CLEANING CONDITION | CONTACT ANGLE INITIAL→AFTER CLEANING | AVERAGE CHANGE |
|---|---|---|
| WET | 1) 40.6°→37.5° <br> 2) 56.6°→52.7° | −3.6° |
| WET+UV | 1) 51.4°→6.2° <br> 2) 58.4°→10.6° | −46.5° |
| WET+IR+UV | 1) 59.2°→4.2° <br> 2) 56.3°→3.9° | −53.7° |

FIG. 12

| CLEANING CONDITION | MOUNTING CONDITION | | |
|---|---|---|---|
| | 280°C, 1.5MPa | 310°C, 4MPa | 330°C, 4MPa |
| WET | PEELING OFF | PEELING OFF | PEELING OFF |
| WET+UV | NO PEELING OFF | NO PEELING OFF | NO PEELING OFF |
| WET+IR+UV | NO PEELING OFF | NO PEELING OFF | NO PEELING OFF |

PRIOR ART

METHOD FOR MANUFACTURING COLOR ORGANIC EL DISPLAY

CROSS REFERENCE TO RELATED APPLICATIONS

This application is a divisional of U.S. patent application Ser. No. 11/184,080 filed on Jul. 19, 2005 and entitled COLOR ORGANIC EL DISPLAY AND METHOD FOR MANUFACTURING THE SAME, and is based on Japanese Patent Applications No. 2004-211593 filed on Jul. 20, 2004, No. 2005-35891 filed on Feb. 14, 2005, and No. 2005-157722 filed on May 30, 2005, the disclosures of which are incorporated herein by reference.

FIELD OF THE INVENTION

The present invention relates to a color organic EL display and a method for manufacturing a color organic EL display.

BACKGROUND OF THE INVENTION

A color organic EL (i.e., electroluminescence) display constituted by interposing a gas barrier layer between an organic EL (electroluminescence) structural body and a color filter is well-known.

This sort of color organic EL display is equipped with such a structure that a color filter layer, a gas barrier layer, and an organic EL structural body have been successively stacked on a substrate.

Specifically, when an organic EL structural body for emitting white light is combined with a color filter, the below-mentioned structure of such a color organic EL display is known. That is, a color filter layer, an overcoat layer, a gas barrier layer, and an organic EL structural body element are successively stacked on a transparent substrate, while the organic EL structural body element emits white light.

In this color organic EL display, the gas barrier layer is provided to prevent difficulties such as dark spots of the white light emitting organic EL structural body and lowering of a luminous efficiency thereof. These difficulties are caused by water contents and the like, which are volatilized from the color filter layer and the overcoat layer, which are made of resin.

Accordingly, as to the gas barrier layer, pin-holeless characteristics are required, and superior step coverage thereof is required. In addition to the above-described performance, other performance such as transparent characteristics and flat characteristics of surfaces is required.

Conventionally, as examples of gas barrier layers, one gas barrier layer has been proposed which contains a silicon oxide and is manufactured by executing a sputtering film forming method. For example, Japanese Laid-open Patent Application No. Hei-11-260562 (which corresponds to EP 1115269-A1) discloses the structure. Also, another gas barrier layer has been proposed in which an insulating inorganic oxide layer is arranged as the gas barrier layer of a color converting element (CCM). For example, Japanese Laid-open Patent Application No. Hei-8-279394 (which corresponds to U.S. Pat. No. 5,909,081) discloses this structure.

However, pin-holes are not considered in view of gas barrier characteristics, as to these conventional gas barrier layers, so that dark spots are easily produced in pixels, and such pixels which cannot maintain desirable light emitting characteristics of organic EL elements are readily produced.

As measures capable of solving such pin-hole problems occurred in these gas barrier layers, one measure has been proposed in which while a gas barrier layer is formed in a multilayer structure, cleaning steps are carried out among film forming steps for these plural gas barrier layers. For instance, Japanese Laid-open patent Application No. 2003-229271 discloses this structure. Another measure has been proposed in which while a gas barrier layer is formed in a multilayer structure, resin layers are distributed to the respective gas barrier layers. For instance, Japanese Laid-open Patent Application No. 2003-282239 discloses the structure.

Also, as the pin-hole measures, one measure has been proposed in which a gas barrier layer is formed by a plasma CVD method (P-CVD method), while this P-CVD method is capable of forming a dense film, as compared with a sputtering method which corresponds to a general-purpose film forming method for a gas barrier layer. For example, Japanese Laid-open Patent Application No. 2004-39468 discloses the structure.

However, the pin-hole measures described in the above documents own problems as to productivity and cost aspects, since the structures of the gas barrier layers and the manufacturing processes thereof are complex.

Also, in the gas barrier layer manufactured by employing the P-CVD method, when the gas barrier layer is formed by way of the P-CVD method, the film forming operations are carried out at a relatively low temperature, since heat resistance characteristics as to the color filter layer and the overcoat layer are considered, which are provided under the gas barrier layer. In this film forming operation, since dense characteristics of these films are deteriorated, gas barrier characteristics thereof are deteriorated. As a result, these layer structures must be replaced by other stacked layer structures, or the film thicknesses of these layers must be made thicker, so that the problem as to the productivity still remains, and thus, the manufacturing cost is increased.

SUMMARY OF THE INVENTION

In view of the above-described problem, it is an object of the present invention to provide a color organic EL display manufactured with low-cost and having simple structure.

A color organic EL display includes: a substrate; a color filter layer disposed on the substrate; a gas barrier layer disposed on the color filter layer; and an organic EL structural body disposed on the gas barrier layer. The substrate and the color filter layer provide an underlayer of the gas barrier layer. The underlayer is a degassed underlayer. The gas barrier layer is provided by an atomic layer deposition method at a temperature equal to or lower than a decomposition starting temperature of the color filter layer.

In the display, since the underlayer of the gas barrier layer is degassed, the amount of gas discharged from the substrate and the color filter layer is reduced. Further, since the gas barrier layer is formed at the temperature equal to or lower than the decomposition starting temperature of the color filter layer by the atomic layer deposition method, the color filter layer is not deteriorated with time. Therefore, the gas barrier layer can be formed appropriately. Further, the gas barrier layer is formed by the atomic layer deposition method, which is superior in coating performance and minimum pin holes, compared with a vacuum deposition method, a sputtering method, and a plasma CVD method; and therefore, step coverage of the gas barrier layer is improved and the number of pin holes is reduced. Furthermore, the gas barrier layer can be formed by single process of the atomic layer deposition method, so that productivity of the display is increased, and the manufacturing cost is reduced. Furthermore, the underlayer of the gas barrier layer is degassed so that the amount of gas discharged from the underlayer is reduced. Therefore, the gas barrier layer is prevented from expanding by the discharged gas. Thus, the gas barrier layer is not peeled off. Thus, the color organic EL display is manufactured with low-cost and having simple structure.

Further, a method for manufacturing a color organic EL display is provided. The display includes a substrate, a color filter layer, a gas barrier layer and an organic EL structural body, which are stacked in this order. The substrate and the color filter layer provide an underlayer of the gas barrier layer. The method includes the steps of: degassing the underlayer of the gas barrier layer; and forming the gas barrier layer by an atomic layer deposition method in such a manner that a plurality of raw material gases is alternately introduced on the substrate under reduced pressure at a temperature equal to or lower than a decomposition starting temperature of the color filter layer.

In the display, the amount of gas discharged from the substrate and the color filter layer is reduced. Further, the color filter layer is not deteriorated with time. Therefore, the gas barrier layer can be formed appropriately. Further, the gas barrier layer is formed by the atomic layer deposition method, which is superior in coating performance and minimum pin holes; and therefore, step coverage of the gas barrier layer is improved and the number of pin holes is reduced. Furthermore, productivity of the display is increased, and the manufacturing cost is reduced. Furthermore, the gas barrier layer is not peeled off. Thus, the color organic EL display is manufactured with low-cost and having simple structure.

BRIEF DESCRIPTION OF THE DRAWINGS

The above and other objects, features and advantages of the present invention will become more apparent from the following detailed description made with reference to the accompanying drawings. In the drawings:

FIG. 8 is a table showing the number of pin holes in a gas barrier layer of different sample, according to the first embodiment;

FIG. 9 is a table showing a peeling off of the gas barrier layer in different degassing condition, according to the first embodiment;

FIG. 10 is a table showing a crack in the gas barrier layer having different film thickness, according to the first embodiment;

FIG. 11 is a table showing an average of variation of contact angle in different cleaning condition, according to the first embodiment;

FIG. 12 is a table showing a peeling off of the gas barrier layer in different mounting condition and different cleaning condition, according to the first embodiment.

DETAILED DESCRIPTION OF THE PREFERRED EMBODIMENTS

Figure 1:
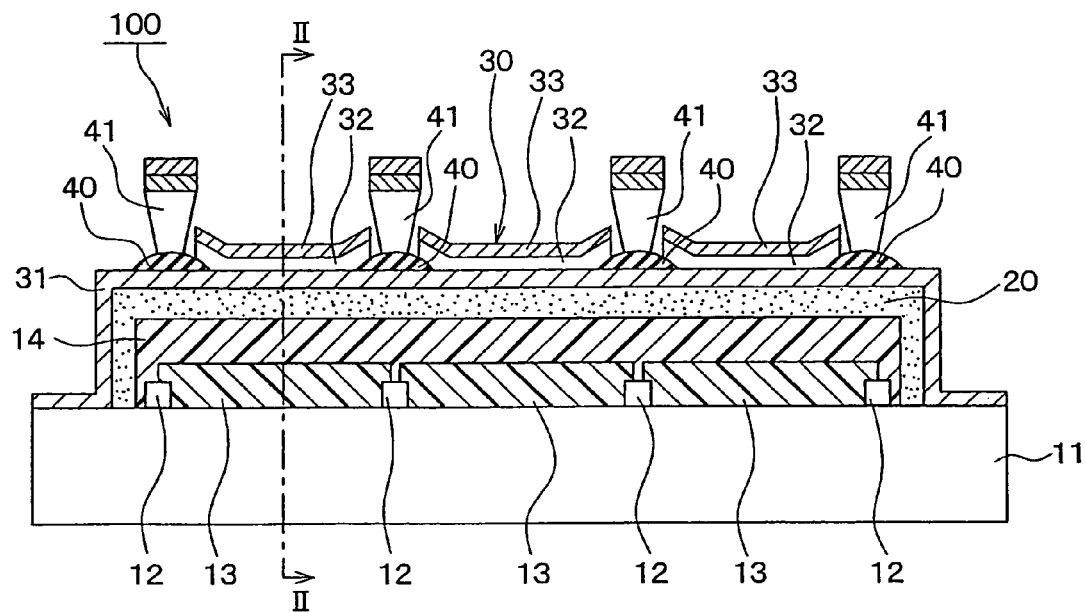
FIG. 1 is a cross sectional view showing a color organic EL display according to a first embodiment of the present invention.

The Inventors of the present invention could succeed in inventive researches of color organic EL displays.

That is, the reason why dark spots of color organic EL displays are produced and durability thereof is deteriorated during durability test is given in the below-mentioned explanations, while the color organic EL displays are manufactured by combining organic EL structural bodies with color filters. That is, gas such as water contents which are contained in the color filters and the overcoats may penetrate through the gas barrier layers, and then, may be reached to the organic EL structural bodies.

Under such a circumstance, firstly, the amounts of gas contained in underlayer portions (for instance, color filter layers and overcoat layers) of the gas barrier layers must be lowered. Secondly, the gas components produced from the underlayer portions must be cut off by such a gas barrier layer having no pin-hole, which can be realized in a simple forming process.

The Inventors have considered various researches, and thus, could conceive the present invention based upon the above-described inventive idea.

Further, in order to form a gas barrier layer, such a low-temperature atomic layer growing method is employed which is capable of realizing such a film that a film forming material can have a superior covering characteristic, and pin-holes are reduced as being permitted as possible, as compared with those of a vacuum vapor deposition method, a sputtering method, and a plasma CVD method. As a result, the formed film (gas barrier layer) can effectively represent a gas barrier function capable of interrupting gasses produced from the underlayer portion thereof.

However, as a result of investigations made by the Inventors, in the steps subsequent to the step for forming the gas barrier layer, for instance, in such steps for cleaning the substrate, in the electrode forming step, in the insulating layer forming step, in the organic EL film forming step, various sorts of medicines are utilized. As a result, there are some possibilities that the gas barrier layer may be damaged by the relevant medicines, depending upon a material of this gas barrier layer.

For instance, in such a case that the gas barrier layer is manufactured by way of the low-temperature atomic layer growing method which is executed at such a low temperature lower than, or equal to the decomposition starting temperature of color filter layers in the respective means, an amorphous alumina ($Al_2O_3$) film is generally employed as the gas barrier layer in view of cost and a film forming stability. This amorphous alumina film has no problem as to the gas barrier characteristic capable of cutting off the gasses produced from the underlayer portion of this gas barrier layer.

However, as a result of investigations made by the Inventors, the below-mentioned difficulty may occur when the amorphous alumina film is processed. That is, the amorphous alumina film is formed on a glass substrate where both the color filter layers and an overcoat layer have been formed by executing the low-temperature atomic layer growing method, and thereafter, this formed amorphous alumina film is combined with the hydroxyl group (—OH), so that this amorphous alumina film may produce such a stable hydroxide as $Al_2(OH)_3$ with respect to the medicine process operations. These medicine process operations are carried out in the substrate cleaning step, the electrode forming step, the insulating layer forming step, the organic EL film forming step, and the like.

In such a case of the stable hydroxide, the amorphous alumina film functioning as the gas barrier layer is altered, and/or is decomposed, so that there are some problems that the film thickness thereof is decreased, and the gas barrier characteristic of this gas barrier layer is deteriorated.

The following fact can be revealed. That is, the amorphous alumina film may be very easily solved with respect to alkali and acid. Especially, this amorphous alumina film may be readily damaged with respect to warmed water having a temperature higher than, or equal to 50° C., an alkaline detergent, and an alkaline processing fluid.

The reason why the amorphous alumina film may be readily damaged in the warmed water is given as follows: That is, if a temperature of water is equal to a room temperature, carbon acid gas contained in air is solved in this water to become neutral. However, if this water is warmed, then carbon acid gas is not solved in this warmed water, but may easily represent alkaline.

Also, in accordance with the investigation made by the Inventors, as to a color organic EL display, in such a case that a soda glass substrate is employed as the substrate and the gas barrier layer is formed on this soda glass substrate by a low-temperature atomic layer forming method, when the soda glass substrate is cleaned and thermally treated, and also, electrodes are formed after the step for forming the gas barrier layer, such a fact can be revealed. That is, a foaming/peeling phenomenon may occur between the gas barrier layer and the soda glass substrate.

Under such a circumstance, the Inventors have deeply performed the investigations, and have improved the above-explained respective means, and therefore, could conceive the below-mentioned means in order prevent the following problems. That is, the gas barrier layer is damaged by the medicines which are used in the steps subsequent to the step for forming the gas barrier layer, and the gas barrier layer is peeled with respect to the soda glass substrate.

(First Embodiment)

Figure 2:
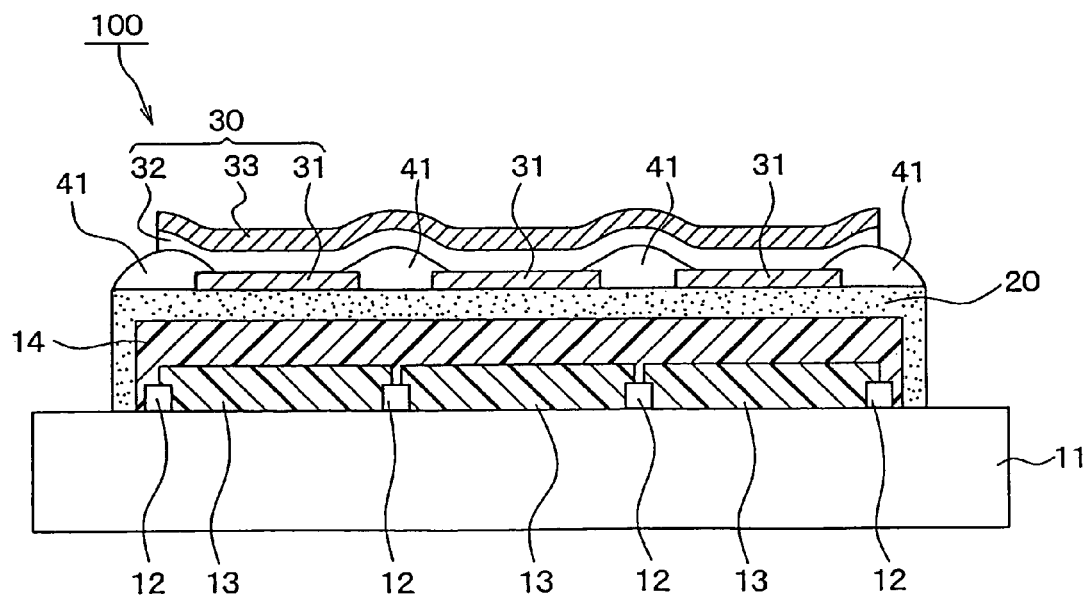
FIG. 2 is a cross sectional view showing the display taken along line II-II in FIG. 1.

FIG. 1 is a diagram for indicating a substantially sectional structure of a color organic EL display 100 according to a first embodiment mode of the present invention. FIG. 2 is a diagram for showing a substantially sectional structure of the color organic EL display 100, taken along a dot and dash line II-II shown in FIG. 1.

[Structure]

A substrate 11 is made of a glass substrate, a substrate made of a resin (resin substrate), or the like. In this color organic EL display 100 of the first embodiment mode, the substrate 11 corresponds to a transparent substrate 11 which is made of a glass substrate.

Red, blue, and green color filter layers 13 which correspond to three primary colors of light have been provided on one plane of this glass substrate 11. It should be noted that shadow masks (black matrix) 12 used to separate the color filter layers 13 have been formed on one plane of the substrate 11, and the color filter layers 13 have been provided with the shadow masks 12. The shadow masks 12 are employed so as to cut off light, and are made of a resin, or a metal. The shadow masks 12 may be provided, if necessary.

A transparent overcoat layer 14 has been formed over the color filter layers 13 and the shadow mask 12 as a flattening layer, if required. It should also be noted that if this overcoat layer 14 may be omitted, then this overcoat layer 14 need not be employed. The color filter layers 13 and the overcoat layer 14 have been mainly formed by an acrylic-series resin. Then, a gas barrier layer 20 has been formed on this overcoat layer 14 in such a manner that the gas barrier layer 20 covers this overcoat layer 14.

A degassing process operation has been carried out with respect to underlayer portions of the gas barrier layer 20, namely, the substrate 11, the color filter layers 13, and the overcoat layer 14. Concretely speaking, the substrate 11 where the various layers up to the overcoat layer 14 have been formed is put into either a thermostatic oven or a vacuum chamber, and then, a degassing process operation and a dehydrating process operation are performed with respect to the conducted substrate 11.

It is preferable that a temperature of this degassing process operation is selected to be higher than, or equal to such a temperature which is applied to the substrate 11 in a manufacturing step after the above-described degassing process step, and lower than, or equal to a decomposition starting temperature of the color filter layers 13. For example, in this first embodiment mode, the degassing process temperature may be preferably selected to be 200° C. to 230° C.

The gas barrier layer 20 has been manufactured by executing an atomic layer growing method at a temperature lower than, or equal to the decomposition starting temperature of the color filter layers 13 and the overcoat layer 14. This atomic layer growing method is referred to as either an "atomic layer epitaxy method (ALE method)" or an "atomic layer deposition method (ALD method)."

In this case, the decomposition starting temperature of the color filter layers 13 and the overcoat layer 14 is approximately 230° C. Also, the gas barrier layer 20 may be formed as an inorganic film which is made of one, or more sorts of metals. The metals are selected from $Al_2O_3$, $TiO_2$, SiN, $SiO_2$, SiON, $ZrO_2$, MgO, $GeO_2$, CaO, $HfO_2$, and ZnO.

Also, a film thickness of the gas barrier layer 20 may be selected to be smaller than, or equal to 100 nm, preferably smaller than, or equal to 60 nm. In this first embodiment mode, the gas barrier layer 20 is such an alumina ($Al_2O_3$) film which has been formed with a thickness of approximately 60 nm.

In the atomic layer growing method which is used in this first embodiment mode, trimethyle aluminium corresponding to an organic metal was used as a material in order that the gas barrier layer 20 can be formed at a relatively low temperature at which no damage is given to both the color filter layers 13 and the overcoat layer 14. That is, to form the organic metal at a temperature lower than, or equal to the decomposition starting temperature of the color filter layer 13 and the overcoat layer 14, the trimethyle aluminum is used.

A film forming temperature of the gas barrier layer 20 may be selected to be on the order of 100 to 250° C. This film forming temperature is determined by considering such a condition that the film forming temperature is selected to be lower than, or equal to the decomposition starting temperature of both the color filter layers 13 and the overcoat layer 14, and further, is selected to be higher than, or equal to a temperature applied to the substrate 11 in forming steps subsequent to the step for forming the gas barrier layer 20. Preferably, this film forming temperature of the gas barrier layer 20 may be selected to be 200° C. to 230° C. in this first embodiment mode.

Then, an organic EL structural body 30 functioning as an organic electronic device has been formed over one plane of the substrate 11, namely on the gas barrier layer 20. In other words, the color organic EL display 100 has been formed in such a manner that while one plane of the substrate 11 where the organic EL structural body 30 is formed has been covered by the gas barrier layer 20, the organic EL structural body 30 has been formed over both this substrate 11 and the gas barrier layer 20.

This organic EL structural body 30 corresponds to such a structural body manufactured by arranging an organic layer 32 containing an organic light emitting material between one pair of electrodes 31 and 33, while one pair of these electrodes 31 and 33 are located opposite to each other. As this organic EL structural body 30, materials and film structures may be employed which are employed in a normal organic EL structural body. One example of concrete structures will now be explained.

First, an anode (lower electrode) 31 functioning as a transparent conducting film has been formed on the gas barrier layer 20. The anode 31 is made of such a transparent conducting film as an ITO (indium tin oxide), and may function as a hole injection electrode.

The anode 31 has been formed by patterning an ITO film (for example, thickness is 150 nm) by way of an etching process in a stripe shape which is extended along right/left directions in FIG. 1. This ITO film has been formed by way of a sputtering method on the gas barrier layer 20 at a film forming temperature of 200° C.

As one example of this stripe shape, a plurality of band-shaped anodes 31 each having a width of 500 μm may be arranged in a stripe shape in an interval of 50 μm.

Further, an insulating film 40 made of an insulating material is formed by performing a photolithography method in order to prevent short-circuit occurred at an edge of the anode 31. Similarly, a partition wall 41 is formed so as to separate a cathode (upper electrode) 33 by the photolithography.

A hole injection layer, a hole transport layer, a light emitting layer, and an electron transport layer are sequentially formed as the organic layer 32 on this anode 31. These layers are made of an organic light emitting material.

For instance, copper phthalic cyanin is formed as the hole injection layer having a thickness of 20 nm by performing a vacuum vapor deposition method. On this hole injection layer, triphenylamine tetramer (HOMO: 5.4 eV, LUMO: 2.4 eV, Eg: 3.0 eV) is formed as the hole transport layer having a thickness of, for example, 40 nm by executing a vacuum vapor deposition manner.

Furthermore, as a red light emitting layer having a thickness of, for example, 2 nm, triphenylamine tetramer into which DCJT (HOMO: 5.3 eV, LUMO: 3.2 eV, Eg: 2.1 eV) has been added by 1% is formed by performing a vacuum vapor deposition method.

On this red light emitting layer, BAlq (HOMO: 5.8 eV, LUMO: 3.0 eV, Eg: 2.8 eV) into which perylene (HOMO: 5.5 eV, LUMO: 2.6 eV, Eg: 2.9 eV) has been added by 1% by weight is formed by way of a vacuum vapor deposition method. This perylene is used as fluorescent dye functioning as a blue light emitting layer having a thickness of, for example, 40 nm. In addition, aluminum complex compound is formed at a thickness of 20 nm as the electron transport layer by way of the vacuum vapor deposition method.

Although not shown in this drawing, a film having a thickness of, for example, 0.5 nm of LiF has been formed as the electron injection layer on these organic layers 32 by way of a vacuum vapor deposition method. On this electron injection layer, a film having a thickness of, for example, 100 nm of Al (aluminum) has been formed as the cathode 33 corresponding to the upper electrode by way of a vacuum vapor deposition method. In this case, the cathode 33 has been formed in a stripe shape which is orthogonally intersected with the anode 31 in such a manner that the stripe shape of this cathode 33 is extended along the right/left directions in FIG. 2.

Then, the organic EL structural body 30 (containing the anode 31, the organic layer 32, and the cathode 33) which emits white light has been formed by using these layers. It should also be noted that film forming temperatures at which the organic layer 32 and the cathode 33 are formed by way of the vacuum vapor deposition method are selected to be approximately the room temperature.

As previously explained, the organic EL structural body 30 of this first embodiment mode has been manufactured as follows: That is, the anode 31 having the stripe shape is overlapped with the cathode 33 which is separated from the anode 31 by the partition wall 41 in such a manner that the anode 31 is orthogonally intersected with the cathode 33, and such a region where these anode 31 and cathode 33 are overlapped with each other constitutes display pixels (namely, original light emitting region) which corresponds to such a portion where a light emitting display should be carried out. Then, the color organic EL display 100 according to this first embodiment mode constitutes a dot matrix display.

In this color organic EL display 100, since a driving DC voltage having a predetermined duty ratio is applied between the anode 31 and the cathode 33 by employing an external circuit, or the like, holes are transported from the anode 31 and electrons are transported from the cathode 33 into the light emitting layer contained in the organic layer 32 respectively in desirable display pixels.

Then, these holes are recombined with these electrons within this light emitting layer, so that the fluorescent material (namely, DCJT, perylene, and Balq in this first embodiment mode) emits light by the radiation energy thereof. This light emission is derived from the substrate 11 via the color filter layers 13.

[Manufacturing Method]

Next, a method for manufacturing the color organic EL display 100 according to the first embodiment mode will now be described, although a slightly duplicated explanation is made.

Both the color filter layers 13 and the overcoat layer 14 are sequentially formed on one plane of the substrate 10 by way of either a spin coating method or a photolithography method. The underlayer portion of the gas barrier layer 20 can be accomplished by executing the previous manufacturing steps. Also, the decomposition starting temperature of the color filter layers 13 and the overcoat layer 14 is selected to be 230° C.

Next, a degassing process operation is carried out with respect to the underlayer portion of the gas barrier layer 20. It is preferable that a temperature of this degassing process operation is selected to be higher than, or equal to such a temperature which is given to the substrate 11 in a manufacturing step after the above-described degassing process step, and lower than, or equal to a decomposition starting temperature of the color filter layers 13. For example, in this first manufacturing step, the degassing process temperature may be preferably selected to be 200° C. to 230° C.

Also, it is preferable that the degassing process step is carried out in a dry atmosphere. Concretely speaking, the substrate 11 on which the various layers up to the overcoat layer 14 have been formed is put into either the thermostatic oven or the vacuum chamber so as to sinter this conducted substrate 11 in such a dry atmosphere as a vacuum atmosphere, and a dry nitrogen gas atmosphere. Then, the degassing process operation and the dehydrating process operation are carried out.

Next, forming of the gas barrier layer 20 is performed. In this forming step, it is preferable to hold the substrate 11 within the dry atmosphere in a consistent manner after the degassing process step until a forming step of the gas barrier layer 20.

Concretely speaking, after the substrate 11 has been set to a film forming apparatus for forming the gas barrier layer 20, a vacuum heating operation is sufficiently carried out so as to execute a dehydrating process operation as to water contents. Thereafter, the gas barrier layer 20 is formed by performing an atomic layer growing method.

Alternatively, after the substrate 11 has been sufficiently heated in a dry atmosphere such as a vacuum atmosphere, or a nitrogen atmosphere in a multi-chamber apparatus in which a chamber for a dehydrating process step has been provided, the substrate 11 may be moved to another chamber for forming the gas barrier layer 20 by way of an atomic layer growing method so as to form this gas barrier layer 20.

Then, in the forming step of the gas barrier layer 20, this gas barrier layer 20 is formed by executing such an atomic layer growing method that material gases are alternately supplied so as to form a thin film under reduced pressure at such a temperature which is lower than, or equal to the decomposition starting temperature of the color filter layers 13.

While the overcoat layer 14 made of the organic material has been interposed between the color filter layers 13 and the gas barrier layer 20, this gas barrier layer 20 is formed at a temperature lower than, or equal to the decomposition starting temperature of both the color filter layers 13 and the overcoat layer 14.

Also, it is preferable to set a film forming temperature of the atomic layer growing method for forming this gas barrier layer 20 to be higher than, or equal to such a temperature applied to the substrate 11 in the forming step subsequent to the forming step of the gas barrier layer 20, namely in the step for forming the organic EL structural body 30.

Such a film forming temperature of the gas barrier layer 20 may be selected to be on the order of 100 to 250° C. In this manufacturing method, this film forming temperature is determined by considering such a condition that the film forming temperature is selected to be lower than, or equal to the decomposition starting temperature of both the color filter layers 13 and the overcoat layer 14, and further, is selected to be higher than, or equal to the temperature applied to the substrate 11 in forming steps subsequent to the step for forming the gas barrier layer 20. Preferably, this film forming temperature of the gas barrier layer 20 may be selected to be 200° C. to 230° C. in this first embodiment mode.

The gas barrier layer 20 is made of alumina by way of an atomic layer growing method. The formation of such a gas barrier layer 20 is carried out as follows: That is, the substrate 11 which has been treated by a degassing process operation and a dehydrating process operation is conducted to a reaction furnace; this reaction furnace is set in a vacuum atmosphere; and then, both vaporized TMA (trimethyl aluminium) and vaporized $H_2O$ are alternately conducted to the reaction furnace by a carrier gas such as an $N_2$ gas. As to this detailed forming method, since a film forming method of a general atomic layer forming method may be employed which has been conventionally carried out, the explanation thereof is omitted.

Next, the organic EL structural body 30 is formed on one plane of the substrate 11, namely on the gas barrier layer 20.

In this first manufacturing method, an ITO film (having thickness of, for example, 150 nm) is patterned by executing an etching process operation so as to form the anode (lower electrode) 31 as the transparent conducting film. This ITO film has been formed on the gas barrier layer 20 by executing a sputtering method at the film forming temperature of 200° C.

The maximum temperature applied to the substrate 11 in a step subsequent to the degassing process step is preferably selected to be the film forming temperature of this anode 31, namely 200° C., and the above-explained degassing process step is preferably carried out at a temperature higher than, or equal to the above-explained film forming temperature of 200° C.

Next, the insulating film 40 is formed on the anode 31 by way of a photolithography method, and subsequently, the partition wall 41 is formed on the insulating film 40 by the photolithography. Next, the organic layer 32 is formed on the anode 31 by way of a vacuum vapor deposition method, while the organic layer 32 has been formed by sequentially forming thereon the hole injection layer, the hole transport layer, the light emitting layer, and the electron transport layer.

Next, both LiF functioning as the electron injection layer, and the cathode 33 functioning as the upper electrode are formed in the film form on the organic layer 32 by way of a vacuum vapor deposition method. A film forming temperature of the organic layer 32 and the cathode 33 by way of the vacuum vapor deposition method is selected to be the room temperature. As a result, the color organic EL display 100 shown in FIG. 1 and FIG. 2 can be accomplished in accordance with the first manufacturing method.

It should also be understood that after this color organic EL device 100 has been manufactured, the outer surface side of the organic EL structural body 30 may be alternatively sealed by a sealing can which is made of either stainless steel or glass and contains a desiccating agent in order to cut off water contents vaporized from the surface of this organic EL structural body 30, while inert gas ($N_2$ gas etc.) containing a very small amount of oxygen, or only the inert gas is employed.

Also, as another sealing method, the outer surface of the organic EL structural body 30 may be covered by such a protection film which has been formed by way of an atomic layer growing method, a sputtering method, a CVD method, a vapor deposition method, or the like. As a result, the deteriorations of the organic EL structural body 30 which are caused by water contents and/or gas can be prevented in a higher level. In addition, if a protection plate made of glass, a resin, a metal, or the like is adhered via an adhesive agent such as a resin onto this protection film, then there is a merit in view of avoiding a production of scratches.

[Effects]

As previously explained, in accordance with the first embodiment mode, the color organic EL display 100 may be provided with employment of the below-mentioned feature. That is, in the color organic EL display 100 manufactured by that the color filter layers 13, the gas barrier layer 20, and the organic EL structural body 30 have been sequentially stacked on the substrate 11, the underlayer portion of the gas barrier layer 20 has been treated by the degassing process operation, and the gas barrier layer 20 has been formed by way of the atomic layer growing method at the temperature lower than, or equal to the decomposition starting temperature of the color filter layer 13.

Since the underlayer portion of the gas barrier layer 20 has been formed by executing the degassing process operation, the amount of the gas produced from the substrate 11, the color filter layers 13, and the like can be reduced to the extremely small amount.

Also, the gas barrier layer 20 has been manufactured by performing the atomic layer growing method at the temperature lower than, or equal to the decomposition starting temperature of the color filter layer 13. As a consequence, the gas barrier layer 20 can be properly formed without deteriorating the color filter layers 13.

Then, when the gas barrier layer 20 is formed, the atomic layer growing method is employed which can realize such a film capable of having the superior covering characteristic for a film forming member and also in which a total number of pin-holes can be reduced as small as possible, as compared with the vacuum vapor deposition method, the sputtering method, and the plasma CVD method. As a result, such a gas barrier layer 20 can be realized in which the step coverage thereof become superior, and a small number of pin-holes are formed, as compared with the prior art.

As a consequence, since the gas barrier layer 20 owns the superior covering characteristic and has substantially no pinhole, the gas such as very small amounts of water contents contained in the color filter layer 13 and the overcoat layer 14 can be blocked by the gas barrier layer 20, so that the gas is not penetrated into the organic EL structural body 30. As a consequence, the deteriorations of the organic EL structural body 30 which are caused by this gas can be properly prevented.

The concrete effects of the gas barrier layer 20 formed in accordance with this first embodiment mode could be confirmed based upon the below-mentioned method. That is, while a gas barrier layer was formed on a glass substrate where an ITO film having a thickness of 150 nm was formed in such a square dimension of 100 mm×100 mm in such a manner that this gas barrier layer 20 covers the entire plane of the ITO film, this glass substrate was dipped for 30 minutes in 50% aqua regia having a temperature of 50° C., which is employed as an etching fluid of the ITO film. In this case, places of pin-holes formed in the gas barrier layer 20 may be readily detected, since the ITO film may be etched and may become more conspicuous as ITO defects.

In order to detect the ITO defects, surface conditions of the glass substrate before/after this glass substrate was dipped in the aqua regia were measured by a defect inspecting apparatus (i.e., KLA ACROTEC 6020). Then, both a place where a defect size was increased, and a newly increased defect place were observed by employing a microscope. Accordingly, a judgment was made as to whether or not this observed defect portion corresponds to an ITO defect of the gas barrier layer which is caused by a pin hole. FIG. FIG. 8 represents a result of this evaluation.

As the gas barrier layer, an $Al_2O_3$ film having a thickness of 30 nm was formed by way of the ALE method as to a sample No. 1 to a sample No. 5; an $Al_2O_3$ film having a thickness of 60 nm was formed by way of the ALE method as to a sample No. 6 to a sample No. 10; and an $SiO_2$ film having a thickness of 300 nm was formed by way of the sputtering method as to a sample No. 11 to a sample NO. 15 as comparative examples.

Figure 3:
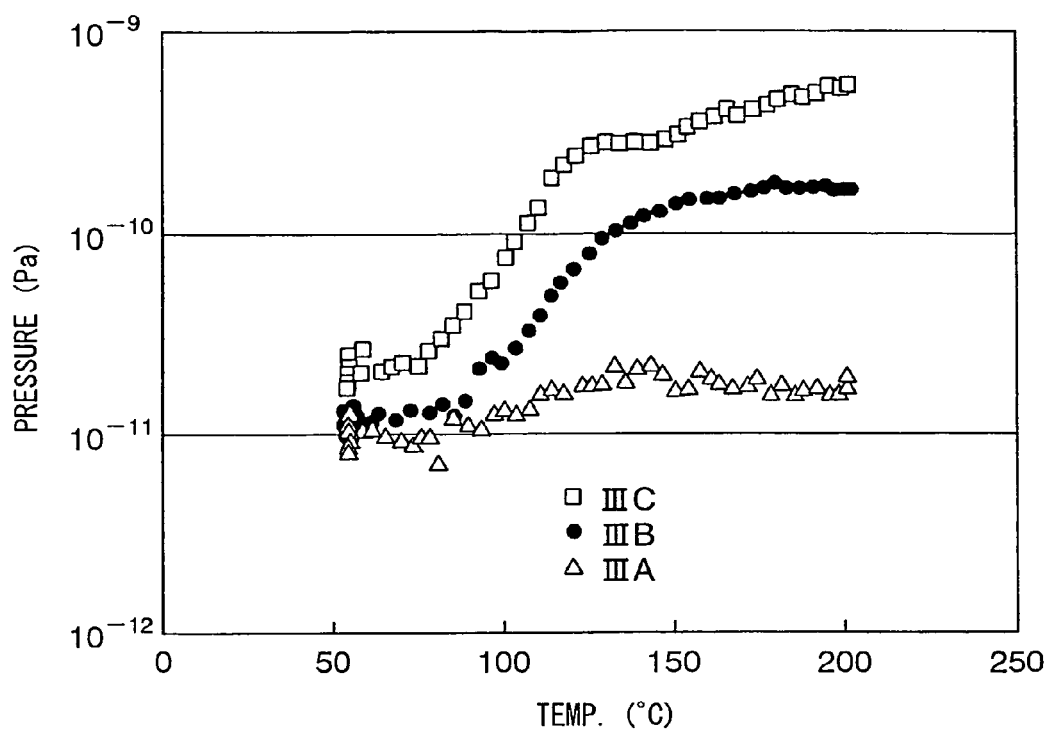
FIG. 3 is a graph explaining results of TDS analysis, according to the first embodiment.

An effect of the degassing process operation was confirmed by performing a thermal desorption spectroscopy (TDS analysis). A substrate in which both a color filter layer and an overcoat layer have been formed on glass was cut in a square dimension of 10 mm×10 mm. Thereafter, three sorts of these cut substrates having the square dimensions of 10 mm×10 mm were processed in accordance with the below-mentioned three processing methods:

1) A first cut substrate was processed by a degassing process operation in a dry nitrogen atmosphere for 2 hours at a temperature of 200° C., and then, the degassing-processed first cut substrate was transported within the dry nitrogen atmosphere. In FIG. 3, IIIA represents a sample of this treatment.

2) A second cut substrate was processed by a similar degassing process operation to the degassing process operation, and then, the degassing-processed second cut substrate was transported in an atmosphere. In FIG. 3, IIIB represents a sample of this treatment.

3) A third cut substrate was not processed by a degassing process operation. In FIG. 3, IIIC represents a sample of this treatment.

In the TDS analysis, while a temperature of the substrate was changed from 50° C. up to 200° C., amounts of projected gas whose molecular weight is in a range between 1 and 199 were measured. FIG. 3 shows pressure changes by the molecular weight 18 ($H_2O$) where the largest amount of gas detected in this TDS analysis was detected.

As a consequence, as to such the sample IIIA which has been processed by the degassing process and then transported in the dry nitrogen atmosphere, there is substantially no pressure change. To the contrary, as to such the sample IIIB or IIIC which has not yet been processed by the degassing process, or has been transported in the atmosphere, emissions of water contents could be clearly confirmed.

As previously explained, the below-mentioned concrete effects could be confirmed, since the underlayer portion of the gas barrier layer 20 has been processed by the degassing process operation, and the gas barrier layer 20 has been formed by executing the atomic layer growing method at the temperature which is lower than, or equal to the decomposition starting temperature of the color filter layer 13.

Also, since the gas barrier layer 20 can be formed in a single process operation, namely the atomic layer growing method, productivity of this gas barrier layer 20 can be improved, and the cost-up problem thereof can be suppressed.

As a consequence, in the color organic EL display 100 manufactured by interposing the gas barrier layer 20 between the organic EL structural body 30 and the color filter layer 13, such a low-cost gas barrier layer 20 having the superior gas barrier characteristic can be realized.

By the way, since the gas barrier layer 20 has been formed by way of the atomic layer forming method, this gas barrier layer 20 can be made dense with less of pin-holes, as compared with the conventional gas barrier layer formed by executing the sputtering method, or the P-CVD method.

However, if the gas barrier layer 20 having less of the pin-holes is merely formed in the color organic EL display 100, then the below-mentioned problem may occur.

In the conventional color organic EL display, the gas barrier layer having the relatively deteriorated dense characteristic has been formed with the large number of pin-holes, as compared with the gas barrier layer 20 formed by way of the atomic layer growing method. As a result, even if gas is produced from the underlayer portion, this produced gas may pass through the gas barrier layer 20.

However, since the gas barrier layer 20 formed by the atomic layer growing method can be made dense with less of the pin-holes in accordance with this first embodiment mode, the gas produced from the underlayer portion can hardly pass through this gas barrier layer 20. As a result, there are some risks that the gas barrier layer 20 is expanded by the produced gas, and the expanded layer portion may be peeled.

As to this risky point, the underlayer portion of this gas barrier layer 20 has been formed by executing the degassing process operation, and thus, the amount of gas which is produced from the degassing-processed underlayer portion is suppressed as small as possible. As a consequence, since such an expansion of the gas barrier layer 20 caused by the gas can be prevented, there is no problem.

In other words, since the gas barrier layer 20 is not simply formed by performing the atomic layer growing method, but the underlayer portion of this gas barrier layer 20 may be realized to solve the problem, which is caused by the gas barrier layer 20 made dense with less of the pin-holes.

In the color organic EL display 100 according to this first embodiment mode, while the overcoat layer 14 made of the organic material has been interposed between the color filter layers 13 and the gas barrier layer 20, the gas barrier layer 20 has been formed at the temperature lower than, or equal to the decomposition starting temperature of the color filter layers 13 and the overcoat layer 14.

As previously explained, in such a case that the overcoat layer 14 made of the organic material has been interposed between the color filter layers 13 and the gas barrier layer 20, if the gas barrier layer 20 has been formed at the temperature lower than, or equal to the decomposition starting temperature of the color filter layers 13 and the overcoat layer 14, then the gas barrier layer 20 can be manufactured in a proper manner, while not only the color filter layers 13, but also the overcoat layer 14 is not deteriorated.

Also, in the color organic EL display 100 of this first embodiment mode, the substrate 11 may be made of a glass substrate, and preferably may be made of a resin substrate. Since the resin substrate owns a better molding characteristic and is made in low cost, as compared with those of the glass substrate, this resin substrate may be preferably used.

Also, as to such a color organic EL display manufacturing method in which the color filter layers 13, the gas barrier layer 20, and the organic EL structural body 30 have been sequentially stacked on the substrate 11, the below-mentioned manufacturing method may be provided in which after the underlayer portion of the gas barrier layer 20 has been treated by the degassing process operation, the gas barrier layer 20 is formed by performing the atomic layer growing method at the temperature lower than, or equal to the decomposition starting temperatures of the color filter layer 13, in which the material gases are alternatively supplied under reduced pressure so as to form the thin film.

The color organic EL display 100 having the feature point can be manufactured in a proper manner. Then, the operation/effects thereof are similar to those of the color organic EL display 100.

Also, in the method for manufacturing the color organic EL device 100, in such a case that the color organic EL display 100 is manufactured by interposing the overcoat layer 14 made of the organic material between the color filter layers 13 and the gas barrier layer 20, such a feature point is also made. That is, the gas barrier layer 20 may be formed at the temperature lower than, or equal to the decomposition starting temperature of the color filter layers 13 and the overcoat layer 14.

Also, it is preferable that a temperature of this degassing process operation is selected to be higher than, or equal to such a temperature which is given to the substrate 11 in the manufacturing step after the degassing process step, and lower than, or equal to the decomposition starting temperature of the color filter layers 13.

If a temperature of a degassing process operation is lower than such a temperature applied to the substrate 11 in a step subsequent to this degassing process operation, there are some possibilities that gas is further produced from the underlayer portion of the gas barrier layer 20 in the step subsequent to the degassing process operation.

As to this technical aspect, if this preferable manufacturing method is employed, then such a problem may be avoided, so that the production of the gas in the step subsequent to the degassing processing step can be reduced. Furthermore, there is no possibility that the color filter layers 13 are deteriorated in the degassing process step.

Also, it is preferable that the degassing process step is carried out in the dry atmosphere.

As a result, since an efficiency of the degassing process as to the underlayer portion of the gas barrier layer 20 can be improved, the degassing process operation is preferable.

Also, it is preferable to hold the substrate 11 in the consistent manner within the dry atmosphere for process steps after the degassing process step until the forming step of the gas barrier layer 20.

This manufacturing method can preferably avoid that the gas components are again attached to the underlayer portion of the gas barrier layer 20 after the degassing process operation of this underlayer portion of the gas barrier layer 20 has been carried out until the step for forming the gas barrier layer 20.

Also, it is preferable that the film forming temperature of the atomic layer growing method for forming the gas barrier layer 20 is higher than, or equal to the temperature applied to the substrate 11 in the step subsequent to the step for forming the gas barrier layer 20.

As a consequence, this manufacturing method may give a merit that occurrences of cracks and peeling as to the gas barrier layer 20 can be suppressed in the step subsequent to the forming step of the gas barrier layer 20.

The gas barrier layer 20 having preferable characteristics is further described in view of protection of peeling off and protection of generating cracks.

[Degassing Process]

In the color organic EL display 100, the degassing process is performed in such a manner that the color filter layer 13 and the overcoat layer 14 as the underlayer of the gas barrier layer 20 are annealed at 200° C. in vacuum. In this case, it is preferred that the number of degassed water molecules is equal to or smaller than $2 \times 10^{16}$ molecules per mm$^3$. Here, the degassed water molecules are discharged from the color filter layer 13 and the overcoat layer 14 at 200° C. in vacuum.

In the gas barrier layer 20 having large density and no pin holes formed by the ALE method, the underlayer of the gas barrier layer 20 is degassed and the amount of the gas discharged from the underlayer is limited so that the gas barrier layer 20 is prevented from expanding according to the gas. Specifically, degree of the degassing process is further studied. Here, the amount of the degassed water is chosen as an index of the degree of the degassing process. The degassed water is discharged from the color filter layer 13 and the overcoat layer 14. The amount of the degassed water is measured by the TDS analysis.

A glass substrate having a color filter layer and an overcoat layer formed on the substrate is prepared. The substrate has dimensions of 10 mm×10 mm. The substrate is degassed at 200° C. in vacuum for 10 minutes, 20 minutes, 60 minutes or 120 minutes. Then, the substrate is transported in dry nitrogen atmosphere. To compare with these substrates, a comparison sample is prepared. The comparison sample is not processed in the degassing process, i.e., the substrate is not degassed.

Figure 4:
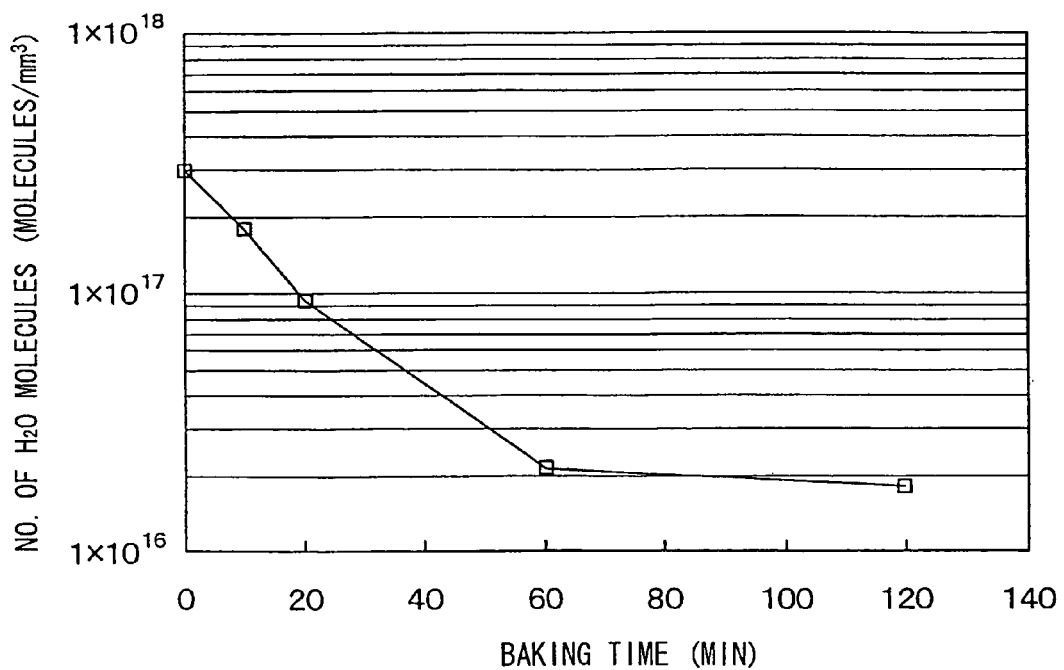
FIG. 4 is a graph showing a relationship between a baking time of a degassing process and the number of degassed water molecules, according to the first embodiment.

According to the TDS analysis, the substrate temperature is changed from 50° C. to 200° C. Then, the amount of the degassed water is calculated on the basis of integrated value of degassed pressure of molecular weight of 18. The molecular weight of 18 represents water, i.e., $H_2O$. The result is shown in FIG. 4. FIG. 4 shows a relationship between the process time of the degassing process and the amount of the degassed water. In FIG. 4, the process time represents as "a baking time at 200° C. (scale on the minute)," which provides the horizontal axis. The amount of the degassed water represents as "the number of water molecules (scale on the molecules per mm$^3$)," which provides the vertical axis.

In FIG. 4, as the process time increases, the amount of the degassed water is reduced. And, in a case where the process time is about 60 minutes, the amount of the degassed water is saturated so that the amount of the degassed water becomes around $2\times10^{16}$ molecules per mm$^3$. Thus, when the substrate is degassed at 200° C. in vacuum for equal to or longer than 60 minutes, the water contained in the color filter layer and the overcoat layer can be removed sufficiently.

Next, the Al$_2$O$_3$ film as the gas barrier layer is deposited on the above five different types of substrates after degassing process, respectively. Specifically, the gas barrier layer is formed on the color filter layer and the overcoat layer by the ALE method. Then, peeling off test is performed after the degassing process. The result is shown in FIG. 9. The color filter layer 13 and the overcoat layer 14 as the underlayer of the gas barrier layer 20 are degassed at 200° C. in vacuum. Further, when the number of the degassed water molecules discharged from the color filter layer 13 and the overcoat layer 14 is equal to or smaller than $2\times10^{16}$ molecules per mm$^3$, the peeling off of the gas barrier layer 20 is prevented. Specifically, when the process time is equal to or longer than 60 minutes, the peeling off of the gas barrier layer 20 is prevented.

[Stress in Gas Barrier Layer]

In the color organic EL display 100, to prevent cracks in the gas barrier layer 20, the stress in the gas barrier layer is reduced. Specifically, the total stress in the gas barrier layer 20 is preferably reduced less than the limited stress of cracks.

This total stress depends on the membrane stress of the material of the gas barrier layer 20 and the thickness of the gas barrier layer 20. Therefore, reducing the thickness of the gas barrier layer 20 is effective for reducing the total stress. Thus, the thickness of the gas barrier layer 20 is determined in view of the total stress. According to the Inventors, the single layer of the Al$_2$O$_3$ film and the single layer of the TiO$_2$ film have no thickness dependency of the membrane stress. Specifically, the membrane stress in the Al$_2$O$_3$ film is 300 MN/m$^2$, and the membrane stress in the TiO$_2$ film is 1400 MN/m$^2$.

Figure 5:
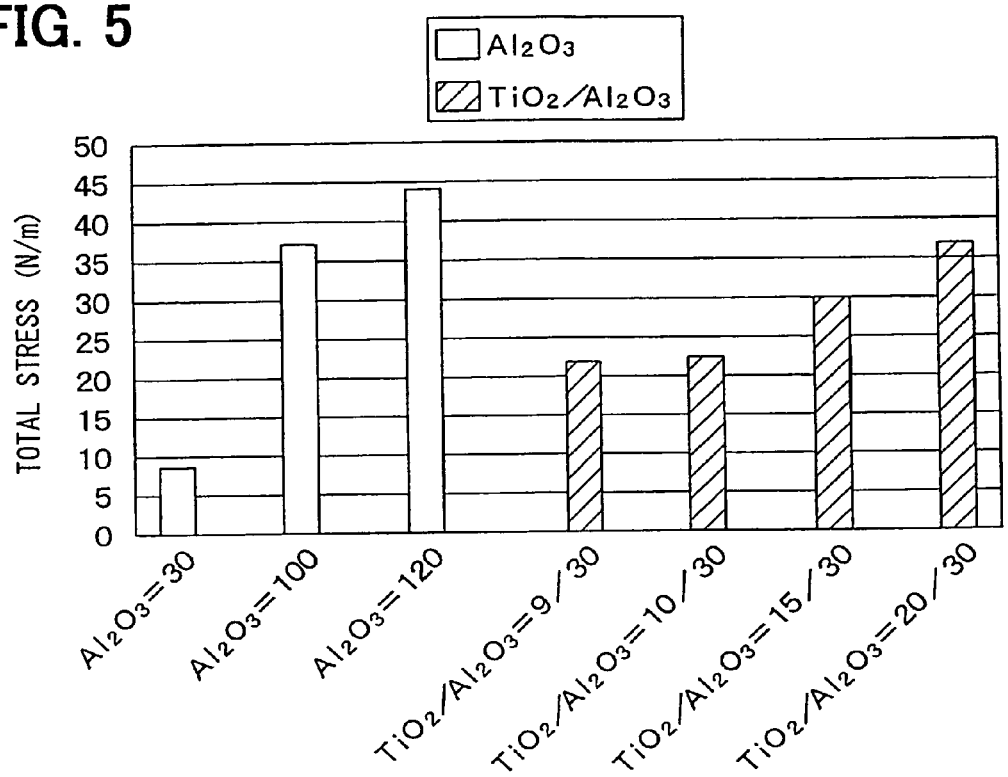
FIG. 5 is a graph showing a relationship between film thickness and total stress in a $TiO_2/Al_2O_3$ multi-layered film, according to the first embodiment.
Figure 6:
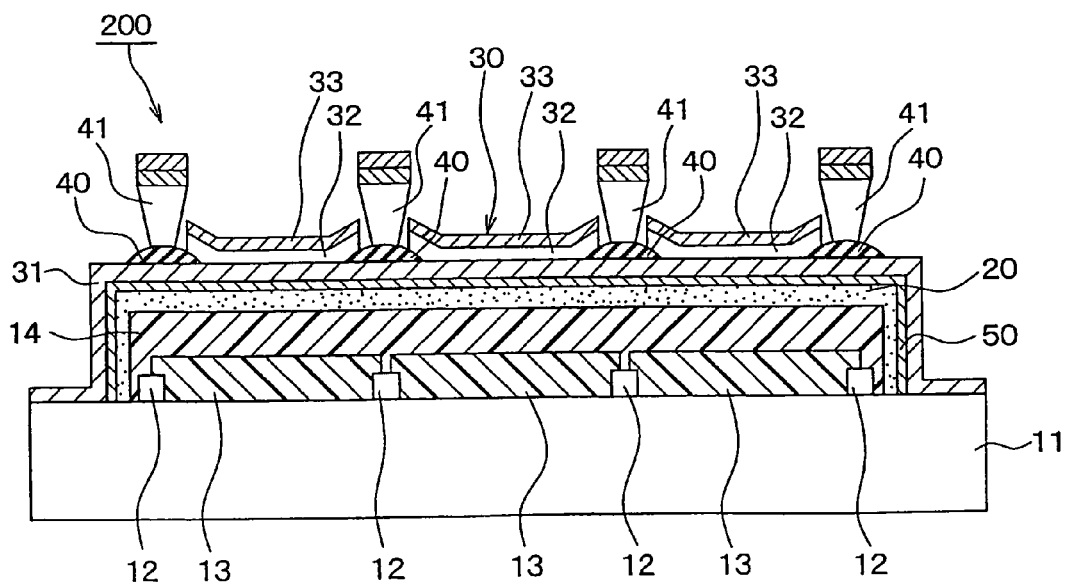
FIG. 6 is a cross sectional view showing a color organic EL display according to a second embodiment of the present invention.
Figure 7:
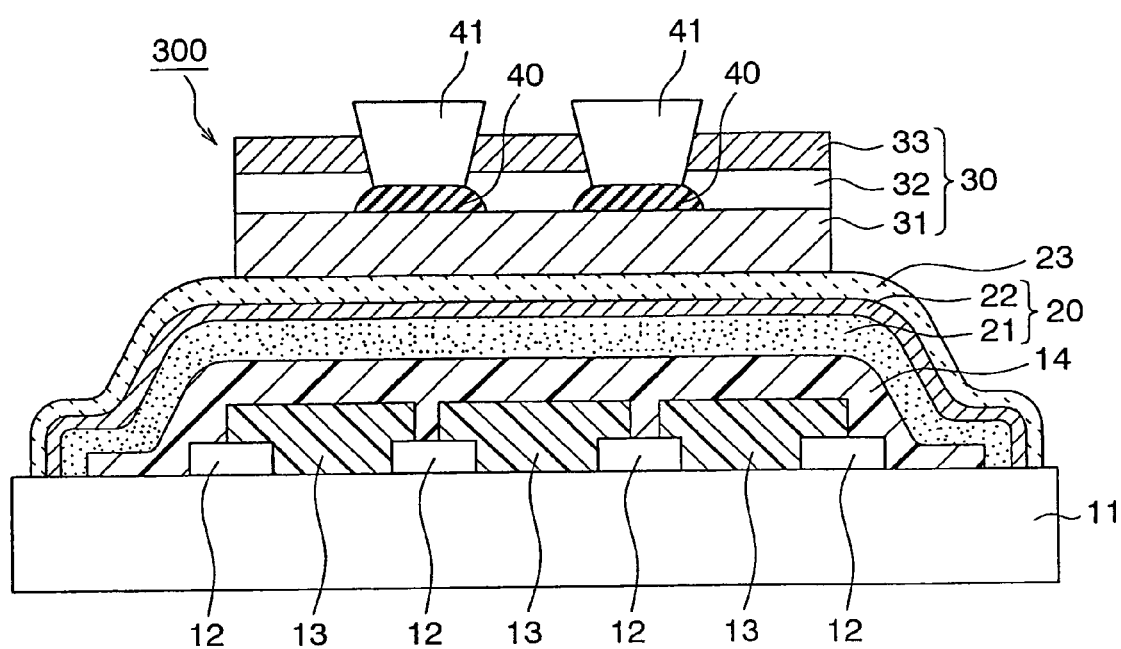
FIG. 7 is a cross sectional view showing a color organic EL display according to a third embodiment of the present invention.

FIG. 5 shows a relationship between the total stress and the film thickness in the gas barrier layer 20. In FIG. 5, "Al$_2$O$_3$=30" represents a case where the gas barrier layer 20 is made of the single layer of the Al$_2$O$_3$ film, and the film thickness of the Al$_2$O$_3$ film is 30 nm. "TiO$_2$/Al$_2$O$_3$=9/30" represents a case where the gas barrier layer 20 is made of the multi-layered film of the Al$_2$O$_3$ film and the TiO$_2$ film, and the total film thickness X of the Al$_2$O$_3$ film is 30 nm and the total film thickness Y of the TiO$_2$ film is 9 nm. Here, the multi-layered film of the Al$_2$O$_3$ film and the TiO$_2$ film can be formed of a two-layer film, in which the Al$_2$O$_3$ film and the TiO$_2$ film are deposited by the atomic layer deposition method, respectively. Further, the multi-layered film of the Al$_2$O$_3$ film and the TiO$_2$ film can be formed of an alternate stacking film, in which the Al$_2$O$_3$ films and the TiO$_2$ films are multiply, repeatedly and alternately stacked each other.

The total stress of the multi-layered film of the Al$_2$O$_3$ film and the TiO$_2$ film shown in FIG. 5 corresponds to the total stress estimated from the membrane stress of the single layer of the Al$_2$O$_3$ film, the membrane stress of the single layer of the TiO$_2$ film, and the ratio of thickness of the Al$_2$O$_3$ film and the TiO$_2$ film.

Next, cracks in the gas barrier layer 20 after deposition is observed. FIG. 10 shows the results of the observation of the cracks in the single layer of the Al$_2$O$_3$ film and in the multi-layered film of the Al$_2$O$_3$ film and the TiO$_2$ film as the gas barrier layer 20.

As shown in FIG. 10, when the gas barrier layer 20 made of the single layer of the Al$_2$O$_3$ film, the cracks generate in the gas barrier layer 20 in a case where the film thickness of the gas barrier layer 20 is equal to or thicker than 120 nm. Thus, it is preferred that the film thickness of the single layer of the Al$_2$O$_3$ film as the gas barrier layer 20 is equal to or thinner than 100 nm. In this case, the total stress in the gas barrier layer 20 is about 37 N/m. Therefore, when the total stress is almost equal to or smaller than 37 N/m, no crack generates in the gas barrier layer 20.

Regarding the multi-layered film of the Al$_2$O$_3$ film and the TiO$_2$ film, the total stress of the gas barrier layer 20 is designed to be equal to or smaller than 37 N/m so that no crack is generated in the gas barrier layer 20. Specifically, the total stress of the multi-layered film is calculated from the results shown in FIG. 5. Specifically, when the gas barrier layer 20 is formed of the multi-layered film of the Al$_2$O$_3$ film and the TiO$_2$ film, the total thickness X (scale on the meter, i.e., m) of the Al$_2$O$_3$ film in the multi-layered film and the total thickness Y (scale on the meter, i.e., m) of the TiO$_2$ film in the multi-layered film satisfy the relationship of:

$$37 \geq 3\times10^8 \times X + 1.4\times10^9 \times Y$$

In this case, the total stress in the gas barrier layer 20 made of the multi-layered film becomes smaller than the stress limit of cracks so that the cracks in the gas barrier layer 20 is prevented.

[Adhesiveness of Gas Barrier Layer]

In the color organic EL display 100, it is preferred that a contact angle of the surface of the underlayer of the gas barrier layer 20 is equal to or smaller than 10 degrees.

Figure 13:
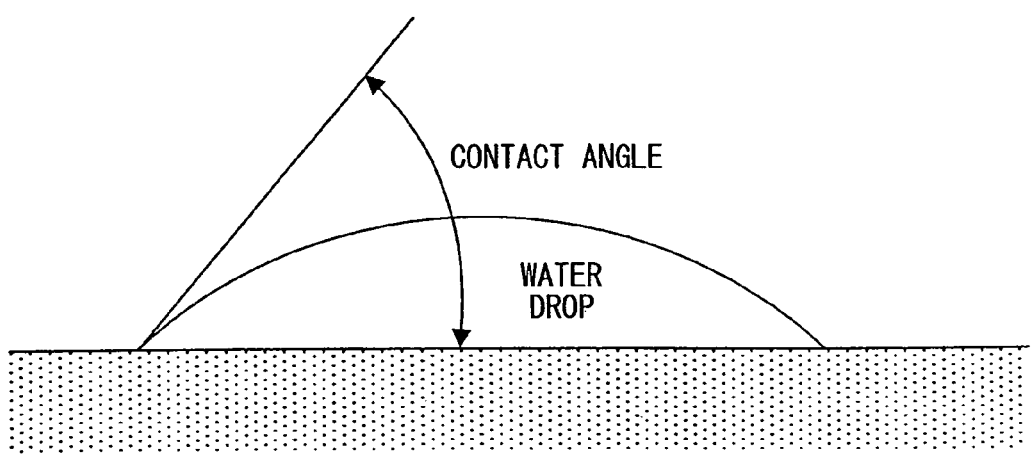
FIG. 13 is a cross sectional view showing the measurement of a contact angle.

FIG. 13 is a cross sectional view showing the measurement of a contact angle. As shown in FIG. 13, the contact angle is the angle at which a liquid/vapor interface meets the solid surface. The contact angle is specific for any given system and is determined by the interactions across the three interfaces. In the example shown in FIG. 13, a water drop 1310 is shown resting on a flat horizontal solid surface 1320. The contact angle $\theta_c$ is the angle at which the water drop 1310 meets the surface 1320.

In a mounting step of the color organic EL display 100, the mounting is performed by thermal press contact method by using anisotropic conductive bonding film (i.e., ACF). To prevent the gas barrier layer 20 from peeling off in the mounting process, the surface of the substrate 11 is cleaned up so that an absorption site, i.e., hydroxyl group, is stabilized. To clean the surface of the substrate 11, a UV process of the surface of the substrate is effective. The UV process is such that the surface of the substrate 11 is irradiated with ultra violet light.

Here, the contact angle of the substrate 11 having the color filter layer 13 is studied under different cleaning conditions. FIG. 11 shows the results of the contact angle test. The contact angle of the substrate 11 is measured by dropping a water drop on the surface of the substrate 11. FIG. 11 shows the contact angle before and after cleaning. That is, the initial contact angle of the substrate 11 and the after cleaning contact angle of the substrate 11 are measured. Here, this contact angle is measured twice, i.e., n=2. Therefore, the average change of the contact angle is obtained. The change of the contact angle is obtained by subtracting the after cleaning contact angle from the initial contact angle.

In the cleaning condition in FIG. 11, WET represents the substrate 11, which is cleaned by a wet washing method only. Wet+UV represents the substrate 11, which is cleaned by the wet washing method, dried with an ordinary drying method, and then, cleaned by a UV ozone washing method. WET+IR+UV represents the substrate 11, which is cleaned by the wet washing method, dried with an infra red light heating and drying method, and then, cleaned by a UV ozone washing method.

As shown in FIG. 11, the initial contact angle of the substrate 11 is in a range between 40 degrees and 60 degrees. Thus, variations of the initial contact angle are large. However, after the substrate 11 is cleaned by the UV ozone washing method, the after cleaning contact angle becomes almost equal to or smaller than 10 degrees.

Then, the substrates 11 cleaned by different cleaning conditions, i.e., WET, WET+UV, and WET+IR+UV conditions are further studied. Specifically, the $Al_2O_3$ film as the gas barrier layer 20 having the thickness of 30 nm is formed on the substrates 11 by the ALD method, respectively. Then, an ACF (i.e., anisotropic conductive film) contact test is performed.

FIG. 12 shows the results of the ACF contact test. The test is performed in different mounting conditions. Then, peeling off of the gas barrier layer 20 is checked. Three mounting conditions are tested. One is such that the mounting is performed at 280° C. under pressure of 1.5 MPa, second is such that the mounting is performed at 310° C. under pressure of 4 MPa, and third is such that the mounting is performed at 330° C. under pressure of 4 MPa.

As shown in FIG. 12, in the substrate 11 performed by the UV process, the gas barrier layer 20 is protected from peeling off. However, in the substrate 11 not performed by the UV process, the gas barrier layer 20 peels off.

Specifically, to prevent the gas barrier layer 20 from peeling off in a case where the substrate 11 is performed only by the wet washing method, it is required to set the adhesive pressure of the ACF equal to or smaller than 1 MPa. However, in this case where the adhesive pressure is equal to or smaller than 1 MPa, the conductivity of the ACF connection is not secured.

Thus, the contact angle on the surface of the substrate 11 is set to be equal to or smaller than 10 degrees. Further, the adhesiveness of the gas barrier layer 20 formed on the surface of the substrate 11 is sufficiently secured. Specifically, in this case, the gas barrier layer 20 is protected from peeling off. Here, the peeling off of the gas barrier layer 20 is generally occurred by heat, pressure or thermal expansion when the ACF is connected to the display.

(Second Embodiment)

FIG. 4 is a diagram for indicating a substantially sectional structure of a color organic EL display 200 according to a second embodiment mode of the present invention.

In this color organic EL display 200, in such a case that the anode 31 has been formed on the gas barrier layer 20 and functions as a transparent conducting film which constitutes the organic EL structural body 30, it is preferable that an $SiO_2$ layer 50 capable of improving a close contacting characteristic between these gas barrier layer 20 and transparent conducting film 31 is interposed between the gas barrier layer 20 and the transparent conducting film 31.

This $SiO_2$ layer 50 may be formed by performing a sputtering method, or the like, and a film thickness thereof may be selected to be, for example, approximately 20 nm. Since the close contacting characteristic between the gas barrier layer 20 and the transparent conducting film 31 can be improved by this $SiO_2$ layer 50, there is a merit that the transparent conducting film 31 is patterned.

(Third Embodiment)

FIG. 5 is a diagram for indicating a substantially sectional structure of a color organic EL display 300 functioning as an organic electronic device element according to a third embodiment mode of the present invention.

Also, the substrate 11 is constituted by a glass substrate, a substrate made of a resin (namely, resin substrate), or the like. The substrate 11 corresponds to such a transparent substrate 11 which is made of non-alkali glass and does not contain such an alkaline component as potassium and sodium.

Similar to the above-explained embodiment mode, the shadow mask (black matrix) 12 and the color filter layers 13 have been formed on one plane of this substrate 11, on which the transparent overcoat layer 14 has been formed as a fattening layer.

Then, the gas barrier layer 20 has been formed on the overcoat layer 14 in such a manner that this gas barrier layer 20 covers the overcoat layer 14 by executing an atomic layer growing method at a temperature lower than, or equal to a decomposition starting temperature of the color filter layer 13 and the overcoat layer 14.

Also, an underlayer portion of the gas barrier layer 20, namely, the substrate 11, the color filter layers 13, and the overcoat layer 14 have been processed by a degassing process operation similar to the above-explained embodiment mode.

Then, a preferable temperature of this degassing process operation is selected to be higher than, or equal to such a temperature which is applied to the substrate 11 in a manufacturing step after the degassing process step, and lower than, or equal to a decomposition starting temperature of the color filter layers 13. For example, the degassing process temperature may be preferably selected to be 200° C. to 230° C.

In this case, the gas barrier layer 20 is manufactured by sequentially stacking a first film 21 and a second film 22. The first film 21 functions as a gas interrupting layer which interrupts gasses produced from the underlayer portion of this gas barrier layer 20. The second film 22 functions as a step withstanding layer having a withstanding characteristic with respect to medicines used in steps subsequent to the step for forming the gas barrier layer 20.

In this case, the first film 21 functioning as the gas interrupting layer in the gas barrier layer 20 may be formed as an inorganic film which is made of one, or more sorts of metals. The metals are selected from $Al_2O_3$, $TiO_2$, SiN, $SiO_2$, SiON, $ZrO_2$, MgO, $GeO_2$, CaO, $HfO_2$, and ZnO.

Also, a film thickness of the first film 21 may be selected to be smaller than, or equal to 100 nm, preferably smaller than, or equal to 60 nm. The first film 21 is such an alumina ($Al_2O_3$) film which has been formed with a thickness of approximately 60 nm.

In the atomic layer growing method which is used to form this first film 21, trimethyle aluminum corresponding to an organic metal was used as a material of the first film 21 in order that the gas barrier layer 20 can be formed at a relatively low temperature at which no damage is given to both the color filter layers 13 and the overcoat layer 14, that is, at a temperature lower than, or equal to the decomposition starting temperature of the color filter layer 13 and the overcoat layer 14.

In this third embodiment mode, a film forming temperature of the first film 21 may be selected to be on the order of 100 to 250° C. This film forming temperature is determined by considering such a condition that the film forming temperature is selected to be lower than, or equal to the decomposition starting temperature of both the color filter layers 13 and the overcoat layer 14, and further, is selected to be higher than, or equal to a temperature applied to the substrate 11 in forming steps subsequent to the step for forming the gas barrier layer 20. Preferably, this film forming temperature of the first film 21 may be selected to be 200° C. to 230° C.

Also, the second film 22 functioning as the step withstanding layer in the gas barrier layer 20 is made of such a material.

That is, this material is combined with a hydroxyl group (namely, OH group), so that a stable hydroxide can be hardly formed. This second film 22 may be formed as an inorganic film which is made of one, or more sorts of metals. The metals are selected from $TiO_2$, SiN, $SiO_2$, SiON, and $Ta_2O_5$.

Also, a film thickness of the second film 22 in the gas barrier layer 20 may be selected to be preferably larger than, or equal to 5 nm. The second film 22 is such a titania ($TiO_2$) film which has been formed with a thickness of approximately 5 nm.

In the atomic layer growing method which is used to form the second film 22 as this step withstanding layer, tetraisoproxytitanium corresponding to an organic metal was used as a material of the second film 22 in order that the gas barrier layer 20 can be formed at a relatively low temperature at which no damage is given to both the color filter layers 13 and the overcoat layer 14, that is, at a temperature lower than, or equal to the decomposition starting temperature of the color filter layer 13 and the overcoat layer 14.

It should be understood that titanium tetrachloride may be alternatively employed other than tetraisoproxytitanium as the material of the second film 22. A film forming temperature of this second film 22 may be preferably selected to be approximately 100 to 250° C.

Also, as shown in FIG. 3, in the color organic EL display 300, an insulating layer 23 having an electric insulating characteristic has been interposed between the second film 22 provided in the gas barrier layer 20 and the organic EL structural body 30.

When the second film 22 in the gas barrier layer 20 owns the electric conducting characteristic, this insulating layer 23 is provided. Since the second film 22 corresponds to the titania film having the electric conducting characteristic, the insulating layer 23 has been provided. When the second film 22 corresponds to an electric insulating film, this insulating layer 23 may be omitted.

This insulating layer 23 may be made of one, or more sorts of metals which are selected from SiN, $SiO_2$, SiON, $Ta_2O_5$, AlN, MgO, CaO, and $GeO_2$. This insulating layer 23 has been formed in a film having a thickness of 20 nm by processing $SiO_2$ by way of a sputtering method.

Then, the organic EL structural body 30 functioning as the organic electronic device has been formed on one plane of the substrate 11, namely on the gas barrier layer 20. In other words, one plane of the substrate 11 where the organic EL structural body 30 will be formed has been covered by the insulating layer 23, and both the first film 21 and the second film 22, which function as the gas barrier layer 20. Then, the organic EL structural body 30 has been formed on this insulating layer 23.

Also, the organic EL structural body 30 functioning as the organic electronic device corresponds to such a structural body manufactured by arranging an organic layer 32 containing an organic light emitting material between one pair of electrodes 31 and 33, while one pair of these electrodes 31 and 33 are located opposite to each other.

Then, as this organic EL structural body 30, materials and film structures may be employed which are employed in a normal organic EL structural body. One example of concrete structures may be made similar to those of the first embodiment mode.

In other words, in the color organic EL display 300, a stripe-shaped anode (lower electrode) 31 which is made of an ITO film has been formed on the insulating layer 23. Also, both an insulating film 40 and a partition wall 41 have been formed by executing a photolithography method.

A hole injection layer, a hole transport layer, a light emitting layer, and an electron transport layer have been sequentially formed as an organic layer 32 formed on this anode 31. These layers have been made of an organic light emitting material.

Then, such a color organic EL display 300 has been manufactured as a dot matrix display, while this dot matrix display has been formed in such a way that the stripe-shaped cathode 33 made of Al is formed on the organic layer 32, and an area where the anode 31 is overlapped with the cathode 33 is arranged as display pixels.

The color organic EL display 300 may be basically manufactured in a similar manner to that of the first embodiment mode.

In this case, entire one plane as to the color filter layers 13 and the overcoat layer 14 has been covered by the insulating layer 23 and the gas barrier layer 20 which is constituted by both the first film 21 and the second film 22. After the underlayer portion of the gas barrier layer 20 has been processed by executing a degassing process operation in a similar manner to that of the above-explained embodiment modes, the first film 21, the second film 22, and the insulating layer 23 are formed.

For instance, the first film 21 made of alumina is formed by way of an atomic layer growing method as follows: That is, the substrate 11 which has been treated by a degassing process operation and a dehydrating process operation is conducted to a reaction furnace; this reaction furnace is set in a vacuum atmosphere; and then, both vaporized TMA (trimethyl aluminium) and vaporized $H_2O$ are alternately conducted to the reaction furnace by a carrier gas such as an $N_2$ gas.

Also, the second film 22 made of titania may be formed by way of the atomic layer growing method in a similar manner to that of the first film 21 except that both tetraisoproxytitanium and pure water are employed as a material.

It is preferable to set a film forming temperature of the atomic layer growing method for forming the first film 22 and the second film 22 to be higher than, or equal to such a temperature applied to the substrate 11 in the forming step subsequent to the forming step of the gas barrier layer 20, namely in the step for forming the organic EL structural body 30. Such a film forming temperature of the first film 21 and the second film 22 may be selected to be on the order of 100 to 250° C. Preferably, this film forming temperature of these first and second films 21 and 22 may be selected to be 200° C. to 230° C. similar to the first embodiment mode as to the film forming temperature of the gas barrier layer 20 made of alumina.

It should also be noted that a detailed film forming operation as to the first film 21 and the second film 22 by the atomic layer growing method may be omitted, because the general-purpose atomic layer growing method can be employed which has been conventionally carried out.

On the other hand, the color organic EL display 300 may be provided with employment of the below-mentioned feature. That is, in the color organic EL display 300 manufactured by that the color filter layers 13, the gas barrier layer 20, and the organic EL structural body 30 have been sequentially stacked on the substrate 11, the underlayer portion of the gas barrier layer 20 has been treated by the degassing process operation, and the gas barrier layer 20 has been formed by way of the atomic layer growing method at the temperature lower than, or equal to the decomposition starting temperature of the color filter layers 13.

Since the underlayer portion of the gas barrier layer 20 has been formed by executing the degassing process operation, the amount of the gas produced from the underlayer portion of the gas barrier layer 20 can be reduced to the extremely small amount. Also, the gas barrier layer 20 having a superior step coverage and less of pin-holes can be properly formed without deteriorating the color filter layers 13.

As a consequence, similarly, in the color organic EL display 300, it is possible to properly avoid the deterioration of the organic EL structural body 30, which is caused by the gas produced from the underlayer portion of the gas barrier layer 20.

Further, the color organic EL display 300 is featured by that the gas barrier layer 20 is manufactured by sequentially stacking the first film 21 and the second film 22. The first film 21 functions as the gas interrupting layer which interrupts gasses produced from the underlayer portion of this gas barrier layer 20. The second film 22 functions as the step withstanding layer having the withstanding characteristic with respect to medicines used in the steps subsequent to the step for forming the gas barrier layer 20.

In accordance with this featured structure, the gas barrier layer 20 can demonstrate the gas barrier characteristic by the first film 21, and moreover, can own the withstanding characteristic with respect to the medicines which are used in the steps subsequent to the step for forming the gas barrier layer 20 based upon the second film 22. As a result, the gas barrier layer 20 can suppress the damages given to the gas barrier layer 20 as being permitted as possible, which are caused by the medicines which are used in the steps subsequent to the step for forming the gas barrier layer 20.

Concrete effects as to the medicine withstanding characteristic owned by the gas barrier layer 20 could be confirmed in accordance with the below-mentioned methods.

That is, one gas barrier layer (will be referred to as "sample No. 301") was manufactured in which an alumina film having a thickness of 100 nm as the first film 21 was formed on silicon substrate by performing the low temperature atomic layer growing method. Further, another gas barrier layer (will be referred to as "sample No. 302") was manufactured in which a titania film having a thickness of 5 nm as the second film 22 was formed on the alumina film by performing the low temperature atomic layer growing method.

Then, both the sample No. 301 and the sample No. 302 were dipped in warmed water of 70° C., and thereafter, sectional planes of these films were observed by using an electron microscope.

As a result, the following conditions could be confirmed. That is, in the sample No. 302 where the titania film has been stacked on the alumina film, the film thicknesses as to both the alumina film and the titania film were not changed, whereas in the sample No. 1 having the single layer structure of the alumina film, the film thickness of the alumina film was reduced, and the surface of this alumina film became rough.

In other words, if the gas barrier layer 20 is manufactured by the first film 21 functioning as the gas interrupting layer, and the second film 22 which has been formed on the first film 21 as the step withstanding layer, then both the first film 21 and the second film 22 may have the superior covering characteristic and own substantially no pin-hole. As a result, these films 21 and 22 can block very small amounts of water contents and of gasses, which are contained in the color filter layers 13 and the overcoat layer 14, and further, can cause these water contents and gasses not to be penetrated into the organic EL structural body 30.

Also, in the color organic EL display 300, since the underlayer portion of the gas barrier layer 20 has been formed by executing the degassing process operation, the amount of the gas produced from the underlayer portion thereof can be reduced to the extremely small amount, and similar to the first embodiment mode, the expansion of the gas barrier layer 20 due to the produced gas can be avoided.

As previously explained, the first film 21 in the gas barrier layer 20, which is typically known as an amorphous alumina film, may be very easily solved with respect to alkali and acid. Especially, this first film 21 may be readily damaged with respect to warmed water having a temperature higher than, or equal to 50° C., an alkaline detergent, and an alkaline processing fluid.

As to this damage aspect, the second film 22 in the gas barrier layer 22 is made of such a material. That is, this material is combined with a hydroxyl group, so that a stable hydroxide can be hardly formed. For instance, this second film 22 is made of one, or more sorts of metals. The metals are selected from $TiO_2$, SiN, $SiO_2$, SION, and $Ta_2O_5$. As a result, this second film 22 can be hardly solved with respect to alkali and acid, and thus, can properly represent the medicine withstanding characteristic.

Also, in the color organic EL display 300, it is preferable that the film thickness of the second film 22 formed in the gas barrier layer 20 is thicker than, or equal to 5 nm. This preferable film thickness could be confirmed in an experimental manner based upon consideration made by the Inventors. As a consequence, if the film thickness of this second film 22 is thicker than, or equal to 5 nm, then this second film 22 can properly represent the medicine withstanding characteristic.

Further, in the color organic EL display 300, when the second film 22 in the gas barrier layer 20 owns the electric conducting characteristic, it is featured by that the insulating layer 23 having the electric insulating characteristic has been interposed between the second film 22 and the organic EL structure body 30.

Normally, in the organic EL structural body 30 which is formed on the gas barrier layer 20, the film which is located just above the gas barrier layer 20 corresponds to the electrode film having the electric conducting characteristic, namely the anode 31. In such a case, if the second film 22 owns the electric conducting characteristic, then the second film 22 may be electrically conducted to the organic EL structural body 30, namely be short-circuited.

As to this short-circuit aspect, since the layer located just above the gas barrier layer 20 is formed as such an insulating layer 23 having an electric insulating characteristic, it is possible to prevent an occurrence of a short-circuit between the gas barrier layer 20 and the organic EL structural body 30, for example, if this insulating layer 23 may be made of one, or more sorts of metals which are selected from SiN, $SiO_2$, SION, $Ta_2O_5$, AlN, MgO, CaO, and $GeO_2$.

Also, in accordance with the investigation made by the Inventors, in such a case that a soda glass substrate is employed as the substrate 11 in the color organic EL display, when the soda glass substrate is cleaned and thermally treated, and also, electrodes are formed after the step for forming the gas barrier layer 20, such a fact can be revealed. That is, a foaming/peeling phenomenon may occur between the gas barrier layer 20 and the soda glass substrate 11.

To solve such a problem, the color organic EL display 300 is featured by that the substrate 11 is made of non-alkali glass.

The Inventors analyzed the foaming/peeling phenomenon occurred between the gas barrier layer 20 and the glass substrate 11. As a result of this analysis, the Inventors could recognize that the alkaline components contained in the soda glass are deposited, or separated due to heat which is produced when the glass substrate 11 is cleaned and processed, and when the film is formed, and thereafter, the deposited alkaline components may lower the close contacting force between the gas barrier layer 20 and the glass substrate 11.

As a consequence, if such a substrate is employed as this substrate 11, which does not contain such alkaline components as potassium and sodium, then it is possible to avoid peeling of the gas barrier layer 20 in such a case that the soda glass substrate is employed.

It should be noted that in order to solve the peeling problem occurred between the substrate 11 and the gas barrier layer 20, another solution may be conceived by employing such a glass substrate which is covered by an inorganic film containing no alkaline component as the substrate 11.

As a result of this alternative solution, this inorganic film may avoid that the alkaline components contained in the soda glass are deposited, or separated due to heat which is produced when the soda glass substrate is cleaned and processed, and when the film is formed. As a result, similar to such a case that the non-alkali glass is employed as the substrate 11, it is possible to avoid peeling of the gas barrier layer 20 in such a case that the soda glass substrate is employed.

In such a method for manufacturing the color organic EL display 300 in such a manner that the color filter layers 13, the gas barrier layer 20, and the organic EL structural body 30 are sequentially stacked on the substrate 11, the following manufacturing method is provided which is featured by that the underlayer portion of the gas barrier layer 20 is treated by the degassing process operation, and thereafter, the gas barrier layer 20 is formed by way of the atomic layer growing method at the temperature lower than, or equal to the decomposition starting temperature of the color filter layer 13, in which the material gases are alternatively supplied under reduced pressure so as to form the thin film.

The forming temperature of the gas barrier layer 20 may be preferably selected to be lower than, or equal to the decomposition starting temperature of both the color filter layers 13 and the overcoat layer 14, and more preferably, may be selected to be higher than, or equal to the temperature applied to the substrate 11 in forming steps subsequent to the step for forming the gas barrier layer 20.

Also, in the manufacturing method, the temperature of the degassing process operation may be preferably selected to be higher than, or equal to the temperature applied to the substrate 11 in the steps subsequent to this degassing process step, and furthermore, may be preferably selected to be lower than, or equal to the decomposition starting temperature of the color filter layer 13. Also, the preferable atmosphere of the degassing process step corresponds to the dry atmosphere. Further, the substrate 11 may be preferably held in the dry atmosphere in the consistent manner after the degassing process step up to the step for forming the gas barrier layer 20, which are similar to the manufacturing methods of the above-explained embodiment modes.

Then, as a method for properly manufacturing the color organic EL display 300 shown in FIG. 3, such a manufacturing method may be provided that the gas barrier layer 20 is manufactured by sequentially stacking the first film 21 and the second film 22, while the first film 21 functions as the gas interrupting layer which interrupts the gasses produced from the underlayer portion of this gas barrier layer 20, and the second film 22 functions as the step withstanding layer having the withstanding characteristic with respect to the medicines used in steps subsequent to the step for forming the gas barrier layer 20.

Also, the manufacturing method for the color organic EL display 300 is featured by that the first film 21 in the gas barrier layer 20 may be formed as an inorganic film which is made of one, or more sorts of metals. The metals are selected from $Al_2O_3$, $TiO_2$, SiN, $SiO_2$, SiON, $ZrO_2$, MgO, $GeO_2$, CaO, $HfO_2$, and ZnO.

Also, the manufacturing method for the color organic EL display 300 is featured by that this second film 22 in the gas barrier layer 20 may be formed as an inorganic film which is made of one, or more sorts of metals. The metals are selected from $TiO_2$, SiN, $SiO_2$, SiON, and $Ta_2O_5$.

Furthermore, in the manufacturing method for the color organic EL display 300, the film forming temperature for forming the gas barrier layer 20 by way of the atomic layer growing method may be preferably selected to be higher than, or equal to 200° C.

As a result of investigations made by the Inventors, if the film forming temperature for forming the gas barrier layer 20 by way of the atomic layer growing method is selected to be higher than, or equal to 200° C., then the close contacting force of the gas barrier layer 20 may be improved, and even when the soda glass substrate is employed, peeling of the gas barrier layer 20 can be prevented.

(Other Embodiments)

It should also be understood that in accordance with the color organic EL display of the present invention, at least, the color filter layers, the gas barrier layer, and the organic EL structural body have been simply stacked on the substrate in the sequential manner. Alternatively, such a stacked layer structure made of these structural elements may be provided, and also, the overcoat layer and other layers may be furthermore interposed between these structural elements.

Also, the structure of the organic EL structural body is not limited only to the concrete example, but also may be realized by employing materials and film structures which are employed in a normal organic EL structural body, and may be alternatively realized by employing materials and film structures which will be employed in a future organic EL structural body.

A major portion of the present invention may be summarized as follows: That is, in the color organic EL display manufactured by that the color filter layers, the gas barrier layer, and the organic EL structural body have been sequentially stacked on the substrate, the underlayer portion of the gas barrier layer has been treated by the degassing process operation, and the gas barrier layer has been formed by way of the atomic layer growing method at the temperature lower than, or equal to the decomposition starting temperature of the color filter layer. Other structural portions may be freely modified in a proper way.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a color organic EL display including a substrate, a color filter layer, a gas barrier layer and an organic EL structural body, which are stacked in this order, wherein the substrate and the color filter layer provide an underlayer of the gas barrier layer, the method comprising the steps of:

degassing the underlayer of the gas barrier layer; and forming the gas barrier layer by an atomic layer deposition method in such a manner that a plurality of raw material gases are alternately introduced on the substrate under reduced pressure at a temperature equal to or lower than a decomposition starting temperature of the color filter layer, wherein the substrate is preserved in a dry atmosphere from when the step of degassing ends to when the step of forming the gas barrier layer begins.

2. The method according to claim 1, further comprising:

forming an overcoat layer disposed between the color filter layer and the gas barrier layer so that the substrate, the color filter layer and the overcoat layer provide the underlayer of the gas barrier layer, wherein the overcoat layer is made of organic material, and the gas barrier layer is formed at the temperature equal to or lower than a decomposition starting temperature of the overcoat layer.

3. The method according to claim 1, wherein the step of degassing is performed at a temperature equal to or lower than the decomposition starting temperature of the color filter layer and equal to or higher than a temperature of the substrate after the step of degassing.

4. The method according to claim 1, wherein the step of degassing is performed in dry atmosphere.

5. The method according to claim 2, wherein the step of degassing is performed in such a manner that the color filter layer and the overcoat layer is heated at 200° C. in vacuum, and the step of degassing is controlled to maintain the number of degassed water molecules to be equal to or smaller than $2 \times 10^{16}$ molecules per mm$^3$.

6. The method according to claim 1, wherein the gas barrier layer is formed at a temperature equal to or higher than a temperature of the substrate after the step of forming the gas barrier layer.

7. The method according to claim 1, wherein the gas barrier layer is made of at least one material selected from the group consisting of $Al_2O_3$, $TiO_2$, SiN, $SiO_2$, SiON, $ZrO_2$, MgO, CaO, $GeO_2$, $HfO_2$ and ZnO.

8. The method according to claim 1, wherein the gas barrier layer is made of a multi-layered film including an $Al_2O_3$ layer and a $TiO_2$ layer.

9. The method according to claim 8, wherein the $Al_2O_3$ layer of the gas barrier layer has a total film thickness defined as X, the $TiO_2$ layer of the gas barrier layer has a total film thickness defined as Y, and the thicknesses of X and Y have a relationship of $37 \geqq 3 \times 10^8 \times X + 1.4 \times 10^9 \times Y$.

10. The method according to claim 1, wherein the underlayer of the gas barrier layer has a contact angle of a water drop equal to or smaller than 10 degrees.

11. The method according to claim 1, wherein the gas barrier layer includes a first film and a second film, which are stacked in this order, the first film is capable of blocking gas generated from the underlayer, and the second film has resistance to chemicals, which are used after the step of forming the gas barrier layer.

12. The method according to claim 11, wherein the first film of the gas barrier layer is made of at least one material selected from the group consisting of $Al_2O_3$, $TiO_2$, SiN, $SiO_2$, SiON, $ZrO_2$, MgO, CaO, $GeO_2$, $HfO_2$ and ZnO.

13. The method according to claim 11, wherein the second film of the gas barrier layer is made of at least one material selected from the group consisting of $TiO_2$, SiN, $SiO_2$, SiON, and $Ta_2O_5$.

14. The method according to claim 1, wherein the gas barrier layer is formed at the temperature equal to or higher than 200° C.

* * * * *